United States Patent
Karmarkar et al.

(10) Patent No.: US 7,133,714 B2
(45) Date of Patent: Nov. 7, 2006

(54) MAGNETIC RESONANCE IMAGING PROBES

(75) Inventors: Parag Karmarkar, Columbia, MD (US); Ingmar Viohl, Milwaukee, WI (US)

(73) Assignee: Surgi-Vision, Inc., Marietta, GA (US)

( * ) Notice: Subject to any disclaimer, the term of this patent is extended or adjusted under 35 U.S.C. 154(b) by 0 days.

(21) Appl. No.: 11/146,900

(22) Filed: Jun. 7, 2005

(65) Prior Publication Data

US 2006/0119361 A1    Jun. 8, 2006

Related U.S. Application Data

(63) Continuation of application No. 10/448,736, filed on May 29, 2003, now Pat. No. 6,904,307.

(60) Provisional application No. 60/383,828, filed on May 29, 2002.

(51) Int. Cl.
*A61B 5/05* (2006.01)
*G01V 3/00* (2006.01)

(52) U.S. Cl. ...................... 600/423; 324/318

(58) Field of Classification Search ............... 600/423; 324/318, 322
See application file for complete search history.

(56) References Cited

U.S. PATENT DOCUMENTS

| | | | |
|---|---|---|---|
| 4,932,411 A | 6/1990 | Fritschy et al. | 128/653 |
| 5,370,644 A | 12/1994 | Langberg | 606/33 |
| 5,447,156 A | 9/1995 | Dumoulin et al. | 128/653.2 |
| 5,662,108 A | 9/1997 | Budd et al. | 128/642 |
| 5,833,608 A | 11/1998 | Acker | 600/409 |
| 5,916,162 A | 6/1999 | Snelten et al. | 600/411 |
| 5,928,159 A | 7/1999 | Eggers et al. | 600/547 |
| 5,964,705 A | 10/1999 | Truwit et al. | 600/423 |
| 6,027,500 A | 2/2000 | Buckles et al. | 606/34 |
| 6,129,670 A | 10/2000 | Burdette et al. | 600/427 |
| 6,263,229 B1 * | 7/2001 | Atalar et al. | 600/423 |
| 6,332,089 B1 | 12/2001 | Acker et al. | 600/424 |
| 6,549,800 B1 * | 4/2003 | Atalar et al. | 600/423 |
| 6,593,884 B1 | 7/2003 | Gilboa et al. | 342/448 |
| 6,606,513 B1 | 8/2003 | Lardo et al. | 600/411 |
| 6,628,980 B1 | 9/2003 | Atalar et al. | 600/423 |
| 6,675,033 B1 | 1/2004 | Lardo et al. | 600/410 |
| 6,701,176 B1 | 3/2004 | Halperin et al. | 600/411 |
| 2002/0040185 A1 | 4/2002 | Atalar et al. | 600/423 |
| 2002/0055678 A1 | 5/2002 | Scott et al. | 600/423 |
| 2002/0095197 A1 | 7/2002 | Lardo et al. | 607/89 |
| 2002/0161421 A1 | 10/2002 | Lee et al. | 607/116 |
| 2003/0028095 A1 | 2/2003 | Tutley et al. | 600/422 |
| 2003/0050557 A1 | 3/2003 | Susi et al. | 600/424 |
| 2003/0199755 A1 | 10/2003 | Halperio et al. | 600/411 |

FOREIGN PATENT DOCUMENTS

EP    0 466 424 A1    1/1992

(Continued)

OTHER PUBLICATIONS

Karmarkar, P.V., An Actice MRI Intramyocardial Injection Catheter, Proc. Int. Soc. Mag. Reson. Med., 11:311 (2003).

(Continued)

*Primary Examiner*—Louis M. Arana

(57) ABSTRACT

A magnetic resonance probe may include a plurality of center conductors, at least some center conductors including a conductive core and an insulator disposed at least partially about the core along at least a portion of the core, a first dielectric layer disposed at least partially about the plurality of center conductors in a proximal portion of the probe, an outer conductive layer at least partially disposed about the first dielectric layer, and a plurality of electrodes, at least one electrode being coupled to one of the center conductors and disposed at least partly on a probe surface.

18 Claims, 6 Drawing Sheets

FOREIGN PATENT DOCUMENTS

| | | |
|---|---|---|
| EP | 0 557 127 A2 | 8/1993 |
| JP | 09094238 | 4/1997 |

OTHER PUBLICATIONS

Kumar, A., MR Imaging with a Biopsy Needle, Proc. Intl. Soc. Mag. Reson. Med. 9:2148 (2001).

Susil, R.C., Multifunctional Interventional devices for MRI: a combined electrophysiology/MRI catheter, Mag. Reson. Med., 47: 594-600 (2002).

Quick, H.H., Endourethrel MRI, Intl., Soc. Mag. Reson. Med., 1:142 (2000).

International Search Report, PCT Application No. PCT/US 03/17085, mailed Sep. 29, 2003.

* cited by examiner

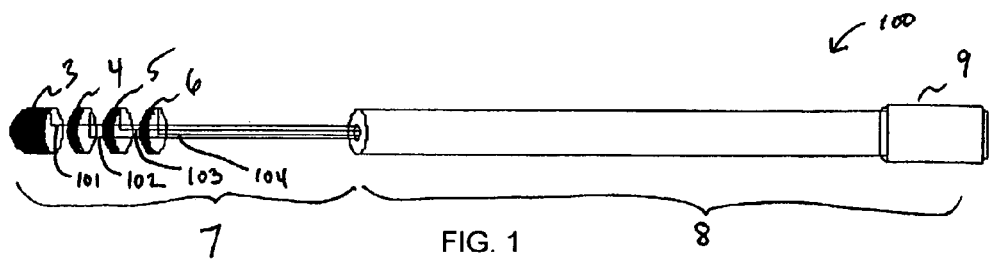
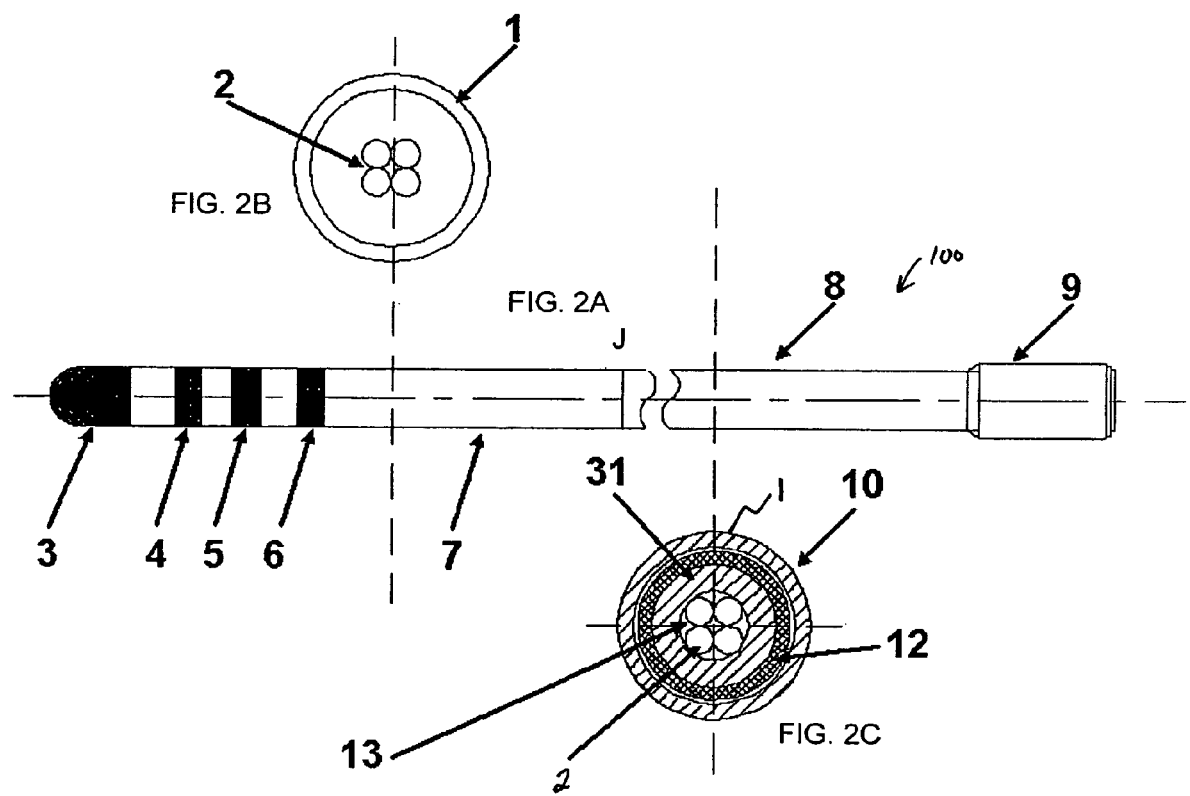

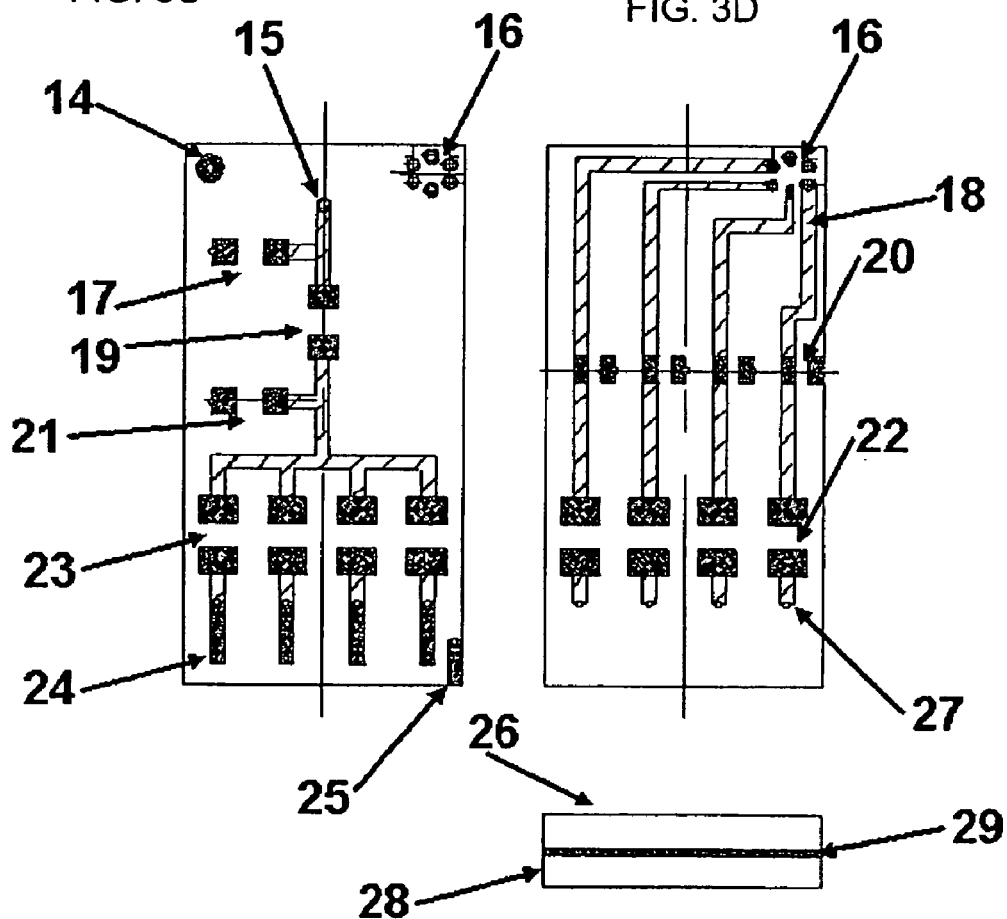

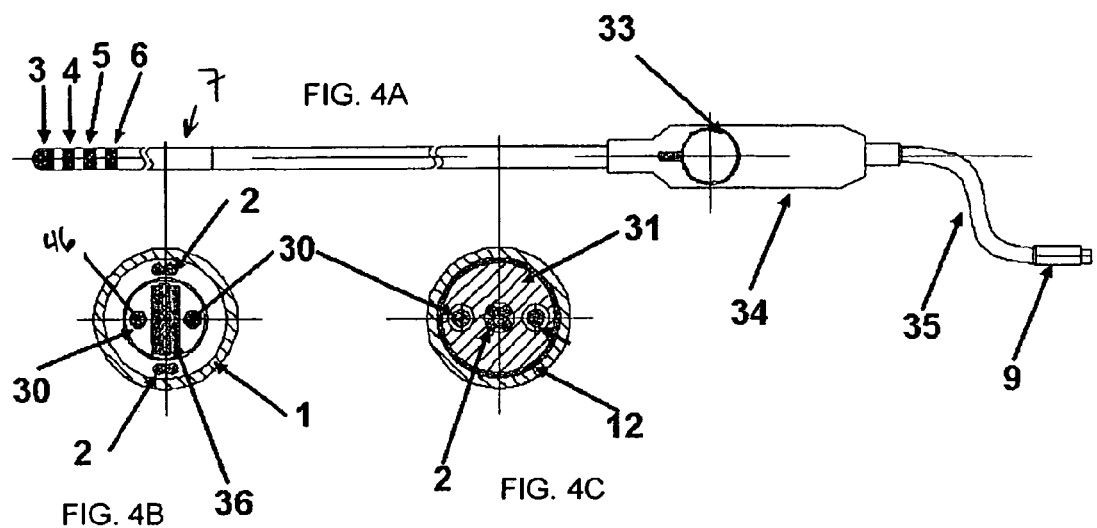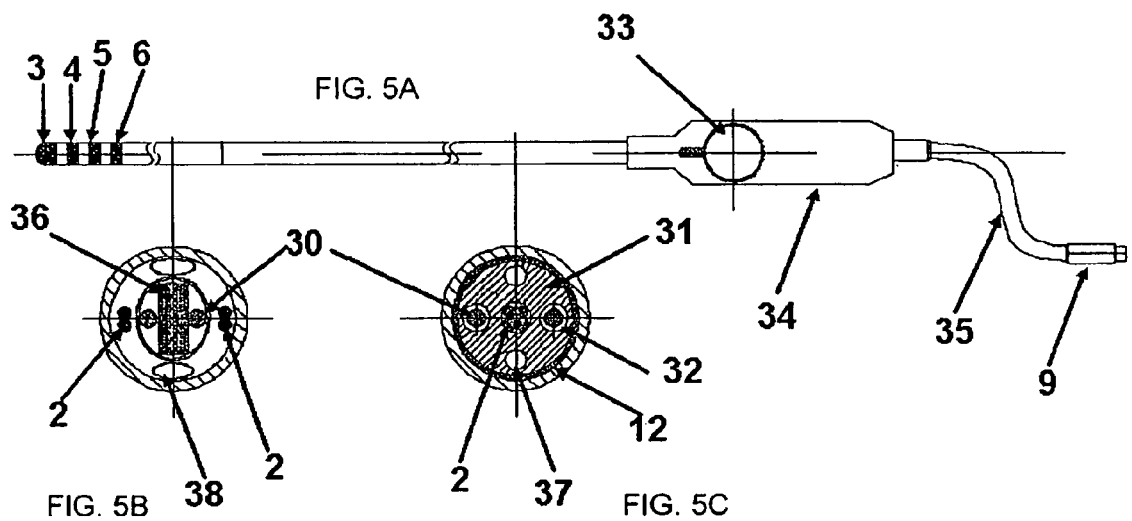

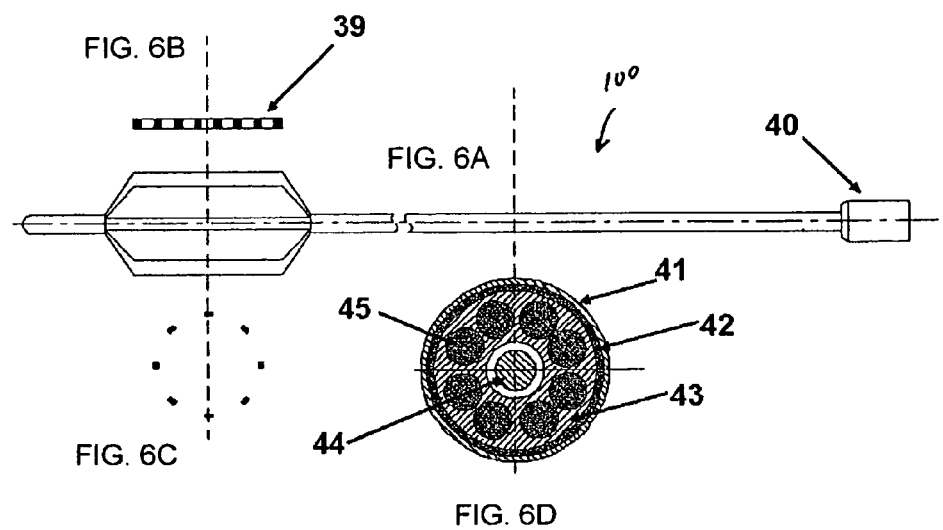
FIG. 6B
FIG. 6A
FIG. 6C
FIG. 6D
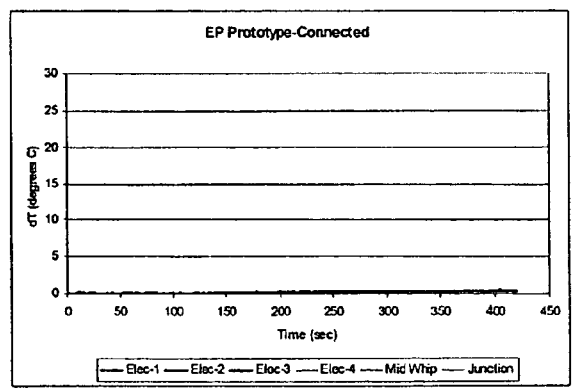
FIG. 7A
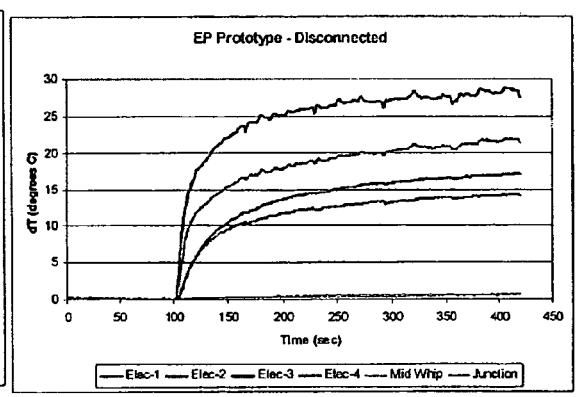
FIG. 7B

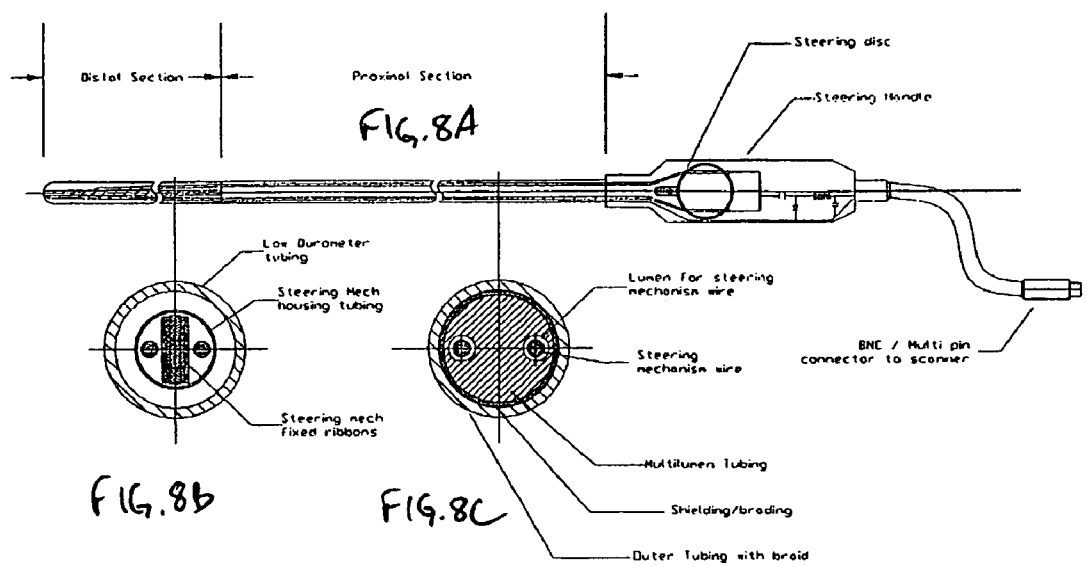
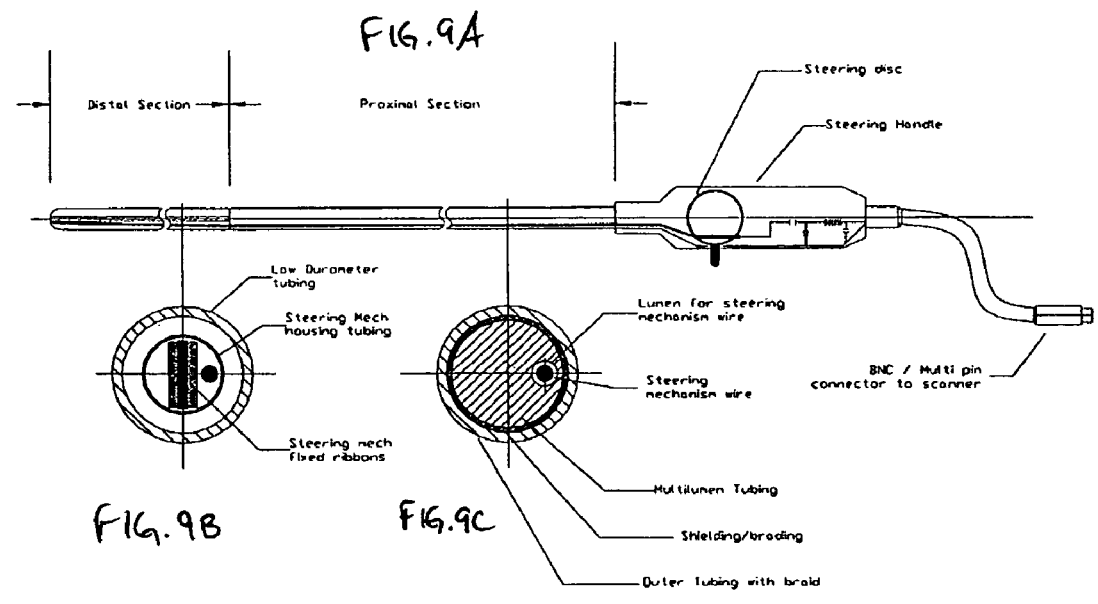

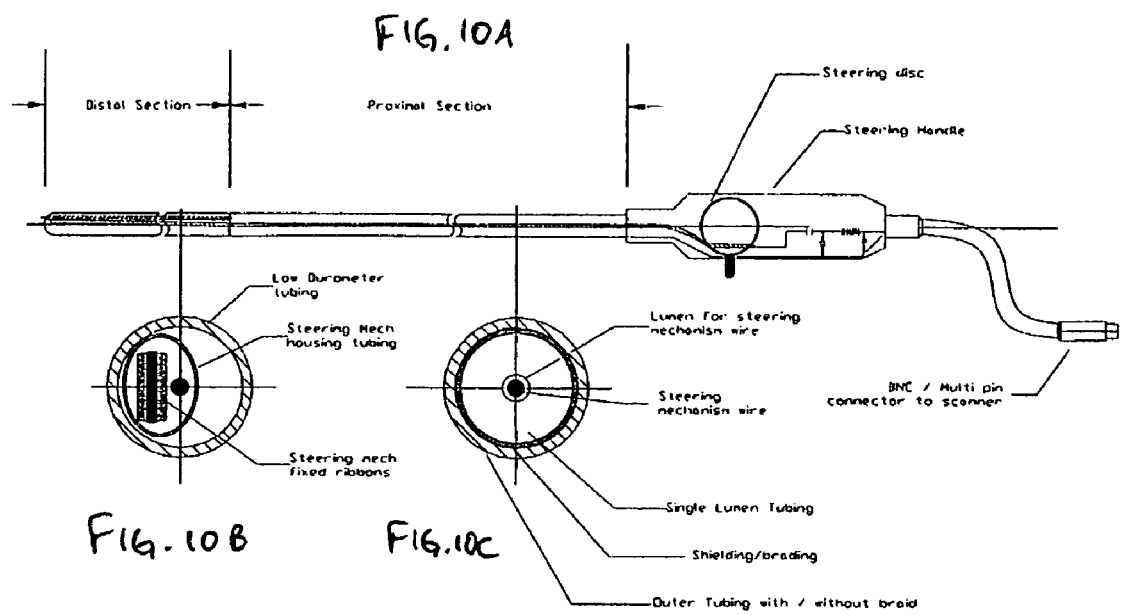

MAGNETIC RESONANCE IMAGING PROBES

CROSS-REFERENCE TO RELATED APPLICATIONS

This application is a continuation of U.S. application Ser. No. 10/448,736, filed May 29, 2003, now U.S. Pat. No. 6,904,307, which claims the benefit of U.S. Provisional Application No. 60/383,828, filed May 29, 2002, both of which are hereby incorporated herein in their entireties by this reference.

BACKGROUND

Leads (catheters) for a wide variety of medical procedures, such as Deep Brain Stimulation (DBS) and cardiac interventions, are typically placed into the body of a subject under stereotactic guidance, fluoroscopy, or other methods. Stereotactic guidance is a static method based on high resolution images taken prior to the procedure and does not take into account displacement of the brain caused by the loss of cerebral spinal fluid (CSF), blood or simple brain tissue displacement by the surgical tool. It is therefore often necessary to perform a real time physiological localization of the target area to augment and verify the previously obtained stereotactic data by observing the patients response to stimulation through the DBS electrodes or by recording and displaying (visual or audible) the action potentials of individual neurons along the path way to the target zone using microelectrodes. These additional steps are time consuming; resulting in procedures between 6–8 hours with a failure rate still remaining between 20–30%.

Cardiac procedures are mainly performed using X-ray fluoroscopy. Because X-ray shadows are the superposition of contributions from many structures, and since the discrimination of different soft tissues is not great, it is often very difficult to determine exactly where the catheter is within the heart. In addition, the borders of the heart are generally not accurately defined, so it is generally not possible to know whether the catheter has penetrated the wall of the heart. Furthermore, lesions are invisible under x-ray fluoroscopy. Thus, it is very difficult to discern whether tissue has been adequately ablated.

SUMMARY

The systems and methods disclosed herein may simplify the manufacturing process for magnetic resonance probes, increase patient safety, reduce if not eliminate tissue heating, and facilitate the performance of multiple functions during MRI interventional procedures such as Deep Brain Stimulation, Electrophysiological Mapping, and/or RF Ablation.

In an embodiment, a magnetic resonance probe may include a plurality of center conductors, at least some center conductors including a conductive core and an insulator disposed at least partially about the core along at least a portion of the core. A first dielectric layer may be disposed at least partially about the plurality of center conductors in a proximal portion of the probe. An outer conductive layer may be at least partially disposed about the first dielectric layer. A plurality of electrodes may be included, at least one electrode being coupled to one of the center conductors and disposed at least partly on a probe surface.

In an embodiment, a probe may include a second dielectric layer at least partially disposed about the outer conductor. In an embodiment, the plurality of center conductors may be magnetic resonance-compatible. In an embodiment, at least one insulator may have a thickness up to about 100 microns. In an embodiment, at least some center conductors may form a first pole of a dipole antenna, and the outer conductive layer may form a second pole of the dipole antenna. In an embodiment, a probe can include a plurality of radially expandable arms. In an embodiment, at least one electrode may be at least partly disposed on an arm.

In an embodiment, an interface circuit may be electrically coupled to the probe, the interface circuit including a signal splitter that directs a signal received from the probe to a magnetic resonance pathway and an electrophysiology pathway, a high-pass filter disposed in the magnetic resonance pathway, a low-pass filter disposed in the electrophysiology pathway, a connector disposed in the magnetic resonance pathway for connecting to a magnetic resonance scanner, and a connector disposed in the electrophysiology pathway for connecting to at least one of a tissue stimulator, a biopotential recording system, and an ablation energy source.

BRIEF DESCRIPTION OF THE DRAWINGS

Embodiments of the disclosed systems and methods will be apparent from the following more particular description of exemplary embodiments as illustrated in the accompanying drawings, in which some reference characters refer to the same parts throughout the various views. The drawings are not necessarily to scale, nor are individual elements necessarily in relative proportion to other elements, emphasis instead being placed upon illustrating principles of the disclosed systems and methods.

FIG. 1 depicts an exemplary embodiment of a magnetic resonance probe having four center conductors and four electrodes.

FIGS. 2A–C depict an exemplary embodiment of a magnetic resonance probe having four center conductors and four electrodes. FIG. 2A depicts a side view. FIG. 2B depicts a cross section in a distal portion of the probe. FIG. 2C depicts a cross section in a proximal portion of the probe.

FIGS. 3A–E depict exemplary embodiments of an interface circuit. FIGS. 3A and 3B depict exemplary electrical schematics; FIGS. 3C–3E depict exemplary physical layouts.

FIGS. 4A–4C depict an exemplary embodiment of a steerable magnetic resonance probe.

FIGS. 5A–5C depict an exemplary embodiment of a magnetic resonance probe having cooling lumens.

FIGS. 6A–6D depicts an exemplary embodiment of a magnetic resonance probe having expandable arms. FIG. 6A depicts a side view of the exemplary probe. FIG. 6B depicts a long axis view of an arm. FIG. 6C depicts a cross section of expanded arms. FIG. 6D depicts a cross section in a proximal portion of the exemplary probe.

FIGS. 7A–B show heating profiles of tissue surrounding an exemplary magnetic resonance probe in the transmit mode that is decoupled (FIG. 7A) or not decoupled (FIG. 7B).

FIGS. 8A–C depict an exemplary embodiment of a bidirectionally steerable magnetic resonance probe having wires that are both pull wires and center conductors.

FIGS. 9A–C depict an exemplary embodiment of a unidirectionally steerable magnetic resonance probe having an offset wire that is both a pull wire and center conductor.

FIGS. 10A–C depict an exemplary embodiment of a unidirectionally steerable magnetic resonance probe having a centered wire that is both a pull wire and center conductor.

DETAILED DESCRIPTION

The disclosed systems and methods relate to the guidance and visualization of diagnostic and therapeutic procedures performed under Magnetic Resonance Imaging (MRI). Such procedures in general benefit from the excellent soft tissue contrast obtainable with MRI. Examples of such applications are Deep Brain Stimulation (DBS) for the treatment of movement disorders (Parkinson's disease, Essential tremor, etc.) and other neurological disorders benefiting from electrical stimulations of section of the brain, as well as the diagnosis and treatment of cardiac arrhythmias including but not limited to atrial fibrillation and ventricular tachycardia.

Real time Magnetic Resonance Imaging can overcome both the inaccuracies of stereotactic planning and the lack of soft tissue contrast as found in X-ray fluoroscopy. The use of Magnetic Resonance Imaging guided interventions can therefore result in shortened procedure times and increased success rates.

Some conditions that may benefit from MRI-guided DBS include Parkinson's disease, essential tremor, and multiple sclerosis. Parkinson's disease is a progressive neurological disorder in regions of the midbrain containing a cluster of neurons known as the "substantia nigra." These neurons produce the chemical dopamine, a neurotransmitter (messenger) responsible for transmitting signals between the substantia nigra and several clusters of neurons that comprise the basal ganglia and is vital for normal movement. When dopamine levels drop below 80%, symptoms of Parkinson's disease begin to emerge causing nerve cells of the basal ganglia to fire out of control; resulting in tremor, muscle stiffness or rigidity, slowness of movement (bradykinesia) and loss of balance. Although medication masks some symptoms for a limited period, generally four to eight years in most patients, they begin causing dose-limiting side effects. Eventually the medications lose their effectiveness, leaving the patient unable to move, speak or swallow. Several preventive and restorative strategies such as neural cell transplantation, neural growth factors, gene therapy techniques and surgical therapies (including DBS), have shown promise in animal studies and human clinical trials. Important links to the cause (including genetic susceptibility and the role of toxic agents) are becoming established. Leading scientists describe Parkinson's as the neurological disorder most likely to produce a breakthrough therapy and/or cure within this decade. Parkinson's disease afflicts approximately 1 million Americans, nearly 40 percent of whom are under the age of 60. Roughly 60,000 cases of PD are diagnosed each year. It is estimated that Parkinson's disease costs society $25 billion or more annually.

Essential tremor (ET) is considered the most common neurological movement disorder affecting nearly 10 million people in the United States. ET is a chronic condition characterized by involuntary, rhythmic tremor of a body part, most typically the hands and arms, often the head and voice, but rarely the legs. ET is generally considered a slowly progressive disorder, although many individuals may have a mild form of ET throughout life that never requires treatment. The most common form of ET affects the arms and hands, usually bilaterally, and is most prominent with the arms held against gravity (postural tremor) or in action (kinetic tremor) such as when writing or drinking from a cup. Unlike patients with Parkinson's disease, patients with ET rarely exhibit a tremor when the arm is at rest. Pharmacological treatment for ET includes a class of drugs called Beta-adrenergic blocking agents (such as propranolol), benefiting about 50 to 60 percent of patients. Primidone (MYSOLINE) is commonly regarded as the most effective drug. Side effects of these drugs include: bradycardia (slow heart rate), hypotension (low blood pressure), dizziness, fatigue, depression, diarrhea, nausea and/or sexual dysfunction. Surgical treatment of ET has for years involved placing a lesion in certain cluster of cells called the thalamus. This procedure, called stereotaxic thalamotomy has been quite effective in substantially reducing tremor intensity, although there is a finite risk of stroke or other surgical complications and bilateral thalamotomies increase the risk of speech impairment (dysarthria). The recent development of high frequency stimulation of the thalamus (deep brain stimulation) has provided a safer and more effective surgical strategy for treating ET. This procedure involves the placement of an electrode in a region of the thalamus (Ventral Intermediate Nucleus or VIM).

Multiple sclerosis (MS) tends to begin in young adulthood and affects about 500,000 people in the United States. Worldwide, the incidence rate is approximately 0.01% with Northern Europe and the northern US having the highest prevalence with more than 30 cases per 100,000 people. MS is a chronic, progressive, degenerative disorder that affects nerve fibers in the brain and spinal cord. A fatty substance (called myelin) surrounds and insulates nerve fibers and facilitates the conduction of nerve impulse transmissions. MS is characterized by intermittent damage to myelin (called demyelination) caused by the destruction of specialized cells (oligodendrocytes) that form the substance. Demyelination causes scarring and hardening (sclerosis, plague) of nerve fibers usually in the spinal cord, brain stem, and optic nerves, which slows nerve impulses and results in weakness, numbness, pain, and vision loss. MS can affect any part of the central nervous system. When it affects the cerebellum or the cerebellum's connections to other parts of the brain, severe tremor can result. Since the sub cortical gray matter also contains myelinated nerve fibers, plaques can also be found in the striatum, pallidum and thalamus. This may be the pathological basis for the other movement disorders seen in a small proportion of patients with MS. Because different nerves are affected at different times, MS symptoms often exacerbate (worsen), improve, and develop in different areas of the body. Early symptoms of the disorder may include vision changes (e.g., blurred vision, blind spots) and muscle weakness. MS can progress steadily or cause acute attacks (exacerbations) followed by partial or complete reduction in symptoms (remission). Most patients with the disease have a normal lifespan.

In a typical DBS procedure, a stereotactic frame, e.g. an Ieksell frame, is attached (bolted) to the patient prior to any portion of the surgical intervention. This is often done in a separate small operating room, either under sedation (Midazolam, Fentanyl, Propofol) and/or local anesthesia (Lidocaine). After the frame is attached, the patient is transferred to the table of the imaging system (CT or MR) and the patient's head is immobilized. A box containing fiduciary markers is fitted on to the frame. These markers will show up in subsequent images in precisely known locations, allowing an accurate mapping between the frame coordinates and brain structures. Based on these detailed images and coordinate mappings, the trajectory for the surgery using a planning software program.

Typical targets for the procedure include regions in the Thalamus, the Globus Pallidum Intemus (Gpi) and the Subthalamic Nucleus (SNT). The target selection strongly depends on the disease and symptoms treated. DBS in the GPi seems to be very effective for drug-induced dyskinesia and helps control tremor and bradykinesia. DBS in the SNT seem to be most effective as measured by ability of patients to reduce their medications, however, there is a potential for increasing dyskinesia. The Thalamus is not necessarily a good target for patients with Parkinson's disease but has been found to improve conditions for patients with Essential Tremor and movement disorder caused by Multiple Sclerosis.

Once the target has been effectively localized and noted to be in a safe location, effort must be placed on a safe entry and trajectory to the target. MRI surface images of the cerebral cortex in combination with the DBS planning scans can be useful to avoid injuries to cerebral arteries or veins at the initial drill holes and due to passage of the DBS electrode, resulting in a catastrophic hemorrhage. With the stereotactic software system, trajectory slices are possible so that every stage of the trajectory can be visualized in terms of its potential harm as an electrode is passed toward the target. Fine adjustments to the entry point can be made to avoid these critical structures or avoid passage through the ventricular system in the patient with large ventricles.

Entry point coordinates are not directly utilized during operative planning but are used by the computer system in creating the trajectory itself. An estimate of accuracy can then be obtained and is usually accurate within several hundred microns and always less than 0.5 cm accuracy so that the results from imaging and planning can be used effectively during the surgical procedure.

Once the planning process is completed, the patient is transferred to the operating room and a hole is drilled into the patient's skull (0.5" to 1.0"). At this point, most surgery centers will perform a real time physiological localization of the target area to augment and verify the previously obtained stereotactic data by observing the patients response to stimulation through the DBS electrodes or by recording and displaying (visual or audible) the action potentials of individual neurons along the path way to the target zone using microelectrodes. The additional step is considered necessary because the shape of the brain and the position of anatomical structures can change during neuro-surgical procedures. Such changes can be due to differences between the patient's position in acquisition and during surgery, reduction in volume due to tissue resection or cyst drainage, tissue displacement by the instruments used, changes in blood and extra cellular fluid volumes, or loss of cerebrospinal fluid when the skull is opened. The amount of brain shift can in a severe case be a centimeter or more and is in most cases between 1 and 2 mm.

In addition to the brain shift phenomenon, some subsection of specific nuclei cannot yet be identified by anatomic means, again requiring a physiological determination of the target area. Given these "uncertainties," several target runs may be required before the desired results are achieved. Throughout the procedure, responses from the patient are necessary to determine if the target area has been reached and if there are any unwanted site effects. Once the target area has been correctly identified, the microelectrode is removed and replaced with the DBS electrode. Stimulation voltage levels are determined by observing the patient and the physiological response. Once all parameters have been correctly adjusted, the DBS electrode is anchored in the skull, a pacemaker is implanted subcutaneously in the subclavicular region and the lead is tunneled under the scalp up the back of the neck to the top of the head.

One of the major shortcomings with stereotactic DBS is the requirement of sub millimeter accuracy in electrode placement for the electrical stimulation of target areas deep inside the brain. As pointed out, brain shifts of 1 to 2 mm can routinely occur between the acquisition of images for the stereotactic surgery and the surgery itself and is either caused by patient transport (misregistration, image distortion), loss of fluid (blood, CSF) or simple tissue displacement by the instruments used. A long recognized solution to these issues has been to perform real time MRI guided surgery. To this end a variety of MRI systems have been developed. "Open MRI" systems which are typically operated at field strength ranging from 0.12 T (Odin) to 1.0 T (Philips) offer a clear advantage in patient access over the closed bore systems ranging in field strength from 1.0 T to 3.0 T. However, these high field short bore systems outperform the low field systems in Signal-to-Noise Ratio since the SNR depends linearly on field strength. Higher SNR translates directly into resolution and/or imaging speed. Efforts have been undertaken to increase the field strength of these open systems (Philips 1.0 T), however, it is not clear that much higher magnetic fields are desirable or achievable due to considerable mechanical challenges of stabilizing the separated pole faces of these magnets and the fact that these magnets are not easily shielded and have a larger fringe field than comparable "closed bore" systems. Furthermore, significant progress has been made to increase the patient access in high field systems as well. Traditionally, whole body 3 T MRI systems have had a length in access of 2 m. Over the past few years dedicated head scanners (Allegra, Siemens) have been developed and have reduced the system length to 1.25 m, allowing relatively easy access to the patient's head. Similar progress has been made in whole body scanners at 1.5 T. Since the actual magnet is significantly shorter (68 to 80 cm) than the overall system further improvements in patient access can be expected. Image quality, speed and patient access are now at a point where true interventional MRI is feasible. All major OEM's have recognized the need for a fully integrated MRI operating room and have made significant progress towards this goal. Siemens has introduced the "BrainSuite", a fully integrated MRI suite for neuro-surgery. Philips, Siemens and GE have also introduced XMRI systems, combining 1.5 T or 3 T whole body systems with an X-Ray fluoroscopy with a patient table/carrier linking both systems.

Atrial fibrillation and ventricular tachyarrhythmias occurring in patients with structurally abnormal hearts are of great concern in contemporary cardiology. They represent the most frequently encountered tachycardias, account for the most morbidity and mortality, and, despite much progress, remain therapeutic challenges.

Atrial fibrillation affects a larger population than ventricular tachyarrhythmias, with a prevalence of approximately 0.5% in patients 50–59 years old, increasing to 8.8% in patients in their 80's. Framingham data indicate that the age-adjusted prevalence has increased substantially over the last 30 years, with over 2 million people in the United States affected. Atrial fibrillation usually accompanies disorders such as coronary heart disease, cardiomyopathies, and the postoperative state, but occurs in the absence of any recognized abnormality in 10% of cases. Although it may not carry the inherent lethality of a ventricular tachyarrhythmia, it does have a mortality twice that of control subjects. Symptoms which occur during atrial fibrillation result from the often rapid irregular heart rate and the loss of atrioventricular (AV) synchrony. These symptoms, side effects of drugs, and most importantly, thrombo-embolic complications in the brain (leading to approximately 75,000 strokes per year), make atrial fibrillation a formidable challenge.

Two strategies have been used for medically managing patients with atrial fibrillations. The first involves rate control and anticoagulation, and the second involves attempts to restore and maintain sinus rhythm. The optimal approach is uncertain. In the majority of patients, attempts are made to restore sinus rhythm with electrical or pharmacologic cardioversion. Current data suggest anticoagulation is needed for 3 to 4 weeks prior to and 2 to 4 weeks following cardioversion to prevent embolization associated with the cardioversion. Chronic antiarrhythmic therapy may be indicated once sinus rhythm is restored. Overall, pharmacologic, therapy is successful in maintaining sinus rhythm in 30 to 50% of patients over one to two years of follow-up. A major disadvantage of antiarrhythmic therapy is the induction of sustained, and sometimes lethal, arrhythmias (proarrhythmia) in up to 10% of patients.

If sinus rhythm cannot be maintained, several approaches are used to control the ventricular response to atrial fibrillation. Pharmacologic agents which slow conduction through the AV node are first tried. When pharmacologic approaches to rate control fail, or result in significant side effects, ablation of the AV node, and placement of a permanent pacemaker may be considered. The substantial incidence of thromboembolic strokes makes chronic anticoagulation important, but bleeding complications are not unusual, and anticoagulation cannot be used in all patients.

In addition to medical management approaches, surgical therapy of atrial fibrillation has also been performed. The surgical-maze procedure, developed by Cox, is an approach for suppressing atrial fibrillation while maintaining atrial functions. This procedure involves creating multiple linear incisions in the left and night atria. These surgical incisions create lines that block conduction and compartmentalize the atrium into distinct segments that remain in communication with the sinus node. By reducing the mass of atrial tissue in each segment, the mass of atrial tissue is insufficient to sustain the multiple reentrant rotors, which are the basis for atrial fibrillation. Surgical approaches to the treatment of atrial fibrillation result in an efficacy of >95% and a low incidence of complications. However, despite these encouraging results, this procedure has not gained widespread acceptance because of the long duration of recovery and risks associated with cardiac surgery.

Invasive studies of the electrical activities of the heart (electrophysiologic studies) have also been used in the diagnosis and therapy of arrhythmias. Focal atrial tachycardias, AV-nodal reentrant tachycardias, accessory pathways, atrial flutter, and idiopathic ventricular tachycardia can be cured by selective destruction of critical electrical pathways with radiofrequency (RF) catheter ablation. Electrophysiologists have attempted to replicate the maze procedure using RF catheter ablation. The procedure is arduous, requiring general anesthesia and procedure durations often greater than 12 hours, with exposure to ionizing x-ray irradiation for over 2 hours. Some patients have sustained cerebrovascular accidents. One of the main limitations of the procedure is the difficulty associated with creating and confirming the presence of continuous linear lesions in the atrium. If the linear lesions have gaps, then activation can pass through the gap and complete a reentrant circuit, thereby sustaining atrial fibrillation or flutter. This difficulty contributes significantly to the long procedure durations discussed above.

Creating and confirming continuous linear lesions and morbidity could be facilitated by improved minimally-invasive techniques for imaging lesions created in the atria. Such an imaging technique may allow the procedure to be based purely on anatomic findings.

The major technology for guiding placement of a catheter is x-ray fluoroscopy. For electrophysiologic studies and ablation, frame rates of 7–15 per second are generally used which allows an operator to see x-ray-derived shadows of the catheters inside the body. Since x-rays traverse the body from one side to the other, all of the structures that are traversed by the x-ray beam contribute to the image. The image, therefore is a superposition of shadows from the entire thickness of the body. Using one projection, therefore, it is only possible to know the position of the catheter perpendicular to the direction of the beam. In order to gain information about the position of the catheter parallel to the beam, it is necessary to use a second beam that is offset at some angle from the original beam, or to move the original beam to another angular position. The intracardiac electrogram may be used to guide the catheters to the proper cardiac tissue.

Intracardiac ultrasound has been used to overcome deficiencies in identifying soft tissue structures. With ultrasound it is possible to determine exactly where the walls of the heart are with respect to a catheter and the ultrasound probe, but the ultrasound probe is mobile, so there can be doubt where the absolute position of the probe is with respect to the heart.

Neither x-ray fluoroscopy nor intracardiac ultrasound have the ability to accurately and reproducibly identify areas of the heart that have been ablated.

A system known as "non-fluoroscopic electro-anatomic mapping" (U.S. Pat. No. 5,391,199 to Ben-Haim), was developed to allow more accurate positioning of catheters within the heart. That system uses weak magnetic fields and a calibrated magnetic field detector to track the location of a catheter in 3D-space. The system can mark the position of a catheter, but the system relies on having the heart not moving with respect to a marker on the body. The system does not obviate the need for initial placement using x-ray fluoroscopy, and cannot directly image ablated tissue.

Embodiments of fixed, steerable, cooled and Multi Electrode Array probes are described that may incorporate multiple functions, such as the recording of MRI imaging signals, bio potentials (electrophysiological, neurological) and cooling. The probes can significantly reduce heating-induced injury in materials surrounding them and can be easily visualized under MRI or X-ray. Disclosed embodiments are illustrative and not meant to be limiting. Drawings illustrate exemplary embodiments and design principles; absolute or relative dimensions are not to be inferred therefrom as necessarily pertaining to a particular embodiment.

FIG. 1 shows schematically an exemplary embodiment of a magnetic resonance probe 100. The probe 100 may have a distal portion 7 and a proximal portion 8. The distal portion may include a plurality of electrodes, such as electrodes 3, 4, 5, 6. As shown, the electrodes may be disposed at least partly on a surface of the probe 100. An electrode can be disposed so that the electrode is disposed on the surface around the circumference of the probe 100 (as shown for electrodes 4, 5, and 6), disposed at the tip of the probe 100 (as shown for electrode 3), or so that the electrode is disposed at the surface around one or more portions of the circumference. The probe 100 shown in FIG. 1 has four electrodes, but other numbers of electrodes may be provided, such as few as one electrode. Probe 100 may include a plurality of center conductors, such as center conductors 101, 102, 103, 104. Other numbers of center conductors may be provided. As shown in this exemplary embodiment, center conductors 101, 102, 103, 104 may be coupled to corresponding electrodes 3, 4, 5, 6. The center conductors may extend through the probe 100 and terminate in a connector 9 at the proximal end of the probe 100. One or more additional layers, described in greater detail below, may be disposed at least partially about the center conductors in the proximal portion 8 of the probe 100.

FIGS. 2A–C depict additional features of an exemplary embodiment of a probe 100. As shown in FIG. 2A, a junction J may define the transition between the distal portion 7 and the proximal portion 8 of the probe 100. The position of the junction J may be selected to provide the probe 100 with preferred electrical properties, discussed in greater detail below. In an embodiment, the junction J may be positioned so that the distal portion 7 of the probe 100 has a length approximately equal to one quarter the wavelength of an MR signal in the surrounding medium. For a medium such as blood or tissue, the preferred length for the distal portion 7 can be in the range of about 3 cm to about 15 cm. The center conductors 2 (referenced collectively) may be coiled to reduce the physical length of the distal portion 7 while maintaining the "quarter wave" electrical length. As shown in cross section FIG. 2B, the distal portion 7 of probe 100 may include a plurality of center conductors 2 and a lubricious coating 1 disposed the plurality of center conductors. Exemplary lubricious coatings include polyvinylpyrrolidone, polyacrylic acid, hydrophilic substance, silicone, and combinations of these, among others.

With continued reference to FIGS. 2A and 2C, the proximal portion 8 of the probe 100 may include one or more additional layers disposed at least partially about the plurality of center conductors 2. For example, a first dielectric layer 31 may be disposed at least partially about the plurality of center conductors 2. The first dielectric layer 31 may define a lumen 13 in which the plurality of center conductors 2 may be disposed. An outer conductive layer 12 may be at least partially disposed about the first dielectric layer. The outer conductive layer 12 may include a braiding. The outer conductive layer 12 may extend through the probe 100 and terminate at the connector 9. A second dielectric layer 10 may be at least partially disposed about the outer conductive layer 12. A lubricious coating 1 may be at least partially disposed about the outer conductive layer 12 and/or the second dielectric layer 10 in the proximal portion 8 of the probe 100.

As described above, a plurality of center conductors may be provided. A center conductor may include a conductive core. A center conductor may include an insulator disposed at least partially about the core along at least a portion of the core. The insulator may be disposed about the core to prevent contact between various cores. The insulator may be disposed along the entire length of the core or along one or portions thereof. In an embodiment, an insulator may be disposed about substantially the entire length of a core except for a distal portion for coupling to an electrode. Insulator may be selectively disposed about core, such as discontinuously or on only a selected aspect of a core, such as an aspect that faces another core. Thus, insulator may be disposed about one or more cores so that one or more center conductors may be touching but cores are not in contact.

The insulator can facilitate positioning a center conductors in close proximity to another center conductor. For example, two center conductors may touch but not have the respective cores be in contact. Such close arrangement of center conductors can permit electrical coupling between the center conductors of high-frequency energy, such as magnetic resonance energy, while preventing coupling of low-frequency energy between the center conductors. Coupling the center conductors for high-frequency energy facilitates receiving magnetic resonance signals with the center conductors because the center conductors so coupled can act as a single electrical entity with respect to the high-frequency energy. Thus, the electrical length of the distal portion 7 of the probe 100 can be preserved, because magnetic resonance energy can be conducted straight through the plurality of center conductors, without allowing the magnetic resonance energy to pass separately through various conductors, thereby creating interference, or causing the high-frequency energy to move through a longer path, thereby unbalancing a magnetic resonance antenna. In contrast, a thin insulating layer can be sufficient to prevent coupling between conductors of the low-frequency signals that may be conducted along selected center conductors. For example, low-frequency coupling may not be desirable when the probe 100 is being operated to measure an electrical potential between two electrodes contacting various tissue regions. If the center conductors were permitted to couple this low-frequency energy, then the potential measurement could be distorted, lost in excessive noise, or attenuated entirely. Similarly, ablation energy delivered along the probe 100 could be shorted between center conductors if the center conductors were permitted to couple low frequency energy.

Thus, the wire insulation is preferably sufficiently thin so that the center conductors are electrically coupled through the insulator at high frequency (e.g., above 10 MHz) but are isolated at frequencies below 0.5 MHz.

Accordingly, insulator properties may be selected to facilitate coupling of high-frequency energy between center conductors, while lessening or inhibiting coupling of low-frequency energy. Properties include the material or materials from which the insulator is made, the thickness of the insulator, the number of layers of insulator, the strength of the magnetic field in which the probe 100 may be immersed, among others.

Because the insulator can prevent coupling of low-frequency energy between the center conductors, the center conductors can be brought into very close proximity to one another, also termed "tightly coupled" to one another. The center conductors may be tightly coupled, for example, by twisted around one another. Twisting or otherwise tight-coupling the center conductors facilitates keeping the center conductors in close proximity in the distal portion 7 of the probe 100, where there may be no, e.g., first dielectric layer to keep the center conductors closely apposed. In addition, because reactive elements need not be interposed between the center conductors to decouple low-frequency energy, manufacture of the probe is simplified. Furthermore, the absence of reactive elements can permit the achievement of small probe diameters. For example, a probe having an outer of diameter of about 15 French or less, suitable for, among other uses, cardiac catheterization, observation, and/or ablation, can be readily constructed using systems and methods disclosed herein. Moreover, deep brain stimulation with a magnetic resonance probe is facilitated, because the diameter can be reduced to, for example, 4 French or less, 3 French or less, 2 French or less, 1.3 French or less, 1 French or less, 0.5 French or less, or even 0.1 French or less. The outer diameter can be affected by the thickness of the center conductor core, thickness of insulator, and thicknesses of other layers that may be included. In an embodiment, wire may be used having a thickness of 56 AWG to 16 AWG as well as thinner and/or thicker wire.

A preferred insulator thickness may be determined as follows. The inductance L and capacitance C between a twisted pair of wires per unit length is given by the equations:

$$L = \left(\frac{\mu 0}{\pi}\right) \cosh^{-1}\left(\frac{D}{d}\right)$$

$$C = C_1 + C_2 - C_3$$

$$C_1 = \int_a^b \frac{\varepsilon_0\, dx}{D + (1.0/\varepsilon_r - 1.0)\sqrt{D^2 - x^2} - \frac{\sqrt{d^2 - x^2}}{\varepsilon_r}}$$

$$C_2 = \frac{\pi \varepsilon_0}{\cosh^{-1}\left(\frac{D}{d}\right)}$$

$$C_3 = \int_a^b \frac{\varepsilon_0\, dx}{D - \sqrt{d^2 - x^2}}$$

where $\epsilon_0 = 8.854$ pF/m, d is the bare wire diameter in meters, D is the insulated wire diameter in meters, and $\epsilon_r$ is the relative dielectric constant of the insulating material. In one illustrative embodiment, a 33 AWG magnet wire was used, the wire having a nominal bare wire diameter of 0.0071" (0.00018034 m) and an insulated diameter of 0.0078" (0.00019812 m) and an approximate dielectric constant of $\epsilon_r = 2$. Thus, the insulator thickness was about 17.78 microns, or about 8.89 microns on a side. In this exemplary case the estimated capacitance per unit length is 89 pF/m. This corresponds to a capacitive impedance $Z_c = 1/(2*\pi*f)$ of about 28 Ω/m at 63.86 MHz and giving a good coupling at the high frequency range. Because the impedance scales inversely with frequency, the low frequency impedance at 100 kHz is estimated to be 14 kΩ/m. An impedance of 10 kΩ/m or greater is sufficient in most applications to provide sufficient decoupling. The high frequency impedance is preferably kept below 100 Ω/m.

The impedance can also be controlled by the choice of dielectric material. Typical materials include polyurethane resins, polyvinyl acetal resins, polyurethane resins with a polyimide (nylon) overcoat, THEIC modified polyester, THEIC modified polyester with a polyamideimide (AI) overcoat, THEIC modified polyester, oxide-based shield coat and a polyamideimide (AI) overcoat, aromatic polyimide resin, bondable thermoplastic phenoxy overcoat, glass fiber, All Wood Insulating Crepe Paper, Thermally Upgraded Electrical Grade Crepe Kraft Paper, High Temperature Aramid Insulating Paper, and combinations of these. The length of the proximal portion can be modified by selecting dielectric materials for the first dielectric layer and/or second dielectric layers. For example, a material with a high dielectric constant can be incorporated in one or more dielectric layers, thereby decreasing the electrical length of the proximal portion and facilitating use of a probe in a relatively shallow anatomic location. Examples of materials with appropriate dielectric constants include ceramics.

An insulator disposed at least partially about a center conductor core may have a thickness in a range up to about 2,000 microns, preferably up to about 500 microns, more preferably up to about 200 microns, still more preferably up to about 100 microns, yet more preferably in a range between about 1 micron and about 100 microns. An insulator may have a thickness in the range of about 5 microns to about 80 microns. An insulator may a thickness in the range of about 8 microns to about 25 microns. An insulator may a thickness in the range of about 10 microns to about 20 microns.

A core may have an insulator disposed about it by dipping the core in insulator. A core may have an insulator disposed about it by extruding an insulator over the core. A core may have an insulator disposed about it by sliding the core into an insulator or sliding an insulator over a core. A core may have an insulator disposed about it by spraying.

A core may be formed of wire. The wire is preferably thin, to promote small probe size, and may in one embodiment be thin insulated copper wires (33 AWG), at times silver coated. In preferred embodiments, the center conductors are formed of magnetic-resonance compatible material. Preferably, the materials are highly conducting, such as silver clad copper. The outer conductive layer may also be formed of wire, such as braided wire. Other preferred materials include a super elastic material, copper, gold, silver, platinum, iridium, MP35N, tantalum, titanium, Nitinol, L605, gold-platinum-iridium, gold-copper-iridium, and gold-platinum.

As mentioned previously, the plurality of center conductors 2 in the distal portion 7 of the probe 100 may form a first pole of a dipole (loopless) magnetic resonance antenna, while the outer conductive layer 12 in the proximal portion 8 of the probe 100 can form the second pole. As discussed above, the length of the distal portion, or first pole, is preferably approximately the "quarter-wave" length, typically about 3 cm to about 15 cm. The proximal portion or second pole can be of the same length, so that the dipole antenna is balanced. A balanced dipole antenna can provide slightly improved signal quality compared to an unbalanced dipole antenna. However, a proximal portion of approximately even 15 cm may be impractical, because a user might want to introduce a magnetic resonance probe into body structures deeper than 15 cm. In practice, it has been found, fortuitously, that lengthening the proximal portion or second pole, while unbalancing the antenna and slightly degrading image quality, permits visualization of a substantial length of the antenna, which facilitates tracking and localization of the antenna. A significant complication of unbalancing the antenna, namely heating effects during the transmission mode, can be avoided by decoupling the antenna with, for example, a PIN diode, as described below. FIGS. 7A–B depict the effects of decoupling an unbalanced antenna. FIG. 7A shows a heating profile of a decoupled antenna, which causes minimal heating to surrounding tissue (typically less than 0.5 degrees Celsius), while FIG. 7B shows a heating profile of a non-decoupled antenna, which can cause gravely injurious and possible fatal tissue heating of over 20 degrees Celsius in a matter of seconds. Adjustments can typically be made to matching, tuning, and/or decoupling circuits, examples of which are shown in FIGS. 3A–E.

The circuits shown in FIGS. 3A–E may have multiple functions and can best described by examining four particular situations, the transmit phase of the MRI system, the receive phase of the MRI system, the recording of electrophysiological signals and the stimulation or deliver of energy of or to the organ or tissue of interest.

The MRI system typically alternates between a transmit and receive state during the acquisition of an image. During the transmit phase relatively large amounts of RF energy at the operating frequency of the system, such as about 63.86 MHz, are transmitted into the body. This energy could potentially harm the sensitive receiver electronics and more importantly, the patient, if the imaging antenna, in this case the probe, would be allowed to pick up this RF energy. The antenna function of the probe therefore is preferably turned off so that the probe becomes incapable of receiving RF energy at the MRI system operating frequency. During the receive phase, in contrast, the body emits the RF energy absorbed during the transmit phase at the same frequency, i.e., 63.86 MHz. A significant amount of the transmitted energy is typically lost due to inefficiencies of the transmitter or has been converted into heat by the body. The RF signal emitted by the body containing the image information is typically therefore many orders of magnitude smaller than the original signal send out by the transmitter. In order to receive this small signal, the antenna function of the probe is preferably turned on so that the probe becomes a highly efficient receiver for RF signals at the MRI systems operating frequency. The alternating state of the probe from being a poor RF antenna (receiver) during the transmit phase to being a good RF antenna (receiver) during the receive phase is called T/R (Transmit/Receive) switching and may be facilitated via a control signal send by the MRI system on the center conductor of connector 15 in FIG. 3A. In an embodiment, this signal may be a small positive voltage (5 to 15 Volts) during the transmit phase, and a small negative voltage (−5 to −20 Volts) during the receive phase. During the image acquisition, the system typically alternates between the transmit and receive phase within milliseconds, i.e., at about a kHz frequency.

During the transmit phase, the positive voltage on the center conductor of connector 15 with respect to the system ground 14 may cause the PIN diode 21 to be conductive and can therefore short the top end of capacitors 23 to ground. The capacitors 23 in combination with the proximal length of the probe form a transmission line; thus, the impedance at the top of the capacitor 23 can be transformed via this transmission line to an impedance $Z_J$ at the junction J connecting the poles of the electric dipole antenna in FIG. 2A. A high impedance at this junction is preferable to disable the reception of RF energy. To achieve a high impedance at the junction J with shorted capacitors 23, the transmission line should have an electrical length equivalent to a quarter wavelength for RF propagation inside the transmission line. The capacitance values for capacitors 23 may be selected to fine-tune the effective electrical length of the transmission line using routine experimentation. Typical values for capacitors can fall in the range of 1–10,000 pF. The precise values of individual capacitors 23 may vary slightly because each center conductor may have a slightly different length (because center conductors may be coupled to electrodes disposed at various positions along the probe). In an embodiment, high Q capacitors such as ATC 100 A or B are preferred. The wavelength may be determined by the diameter of the center conductor bundle, the dielectric constant of the dielectric material, and the inner diameter of the outer conductive layer. In a typical exemplary embodiment, the physical length of the proximal section of the probe forming the transmission line may be 90 cm. Disabling the antenna function of the probe by presenting a high impedance at the junction J is known as "decoupling."

With continued reference to FIGS. 3A–E, during the receive phase, a negative voltage on the center conductor of connector 15 with respect to the system ground 14 can "reverse bias" the diode 21, thereby rendering it non-conductive. The antenna impedance seen by the MRI system is preferably near 50Ω for optimal performance. Typically, the impedance of the electric dipole antenna and the capacitors 23 is transformed to present the appropriate impedance to the systems. This transformation may be achieved via selection of appropriate inductor 19 and capacitor 17. Preferably, the values for elements 19 and 17 may be chosen to pass low frequency current, such as a switched DC signal to diode 21.

The T/R switching voltages are preferably not passed onto the probe since the switching voltage, which can have a frequency around 1 kHz, may cause unwanted stimulation of the organ or tissue under examination. To combat this, capacitors 23, providing a high-pass filter function, can block propagation of the T/R switching voltage into the probe.

With further reference to FIGS. 3A–E, because the antenna function of the probe is enabled during the receive phase, the antenna will pick up RF (63.86 MHz) signals emitted from the body. As shown in FIG. 3A, the RF signal may be routed through the capacitors 23 to the MRI system connector 15 and is processed by the MRI system. As described above, capacitors 23 may function as high-pass filters so that the high-frequency MRI signal is passed to the MRI system, but lower frequency signal, such as the switching signal, electrophysiological stimulation signal, biopotential measuring signal, and/or ablative energy signal are blocked. The lower-frequency signals may instead be routed through another circuit, depicted in FIG. 3B. The signal at contacts 24 may be split into two sets of leads, one set conveying the high-frequency magnetic resonance signal to the magnetic resonance signal pathway that may include capacitors 23 (FIGS. 3A and C), and the other set conveying lower frequency signals to the electrophysiology pathway that may include inductors 22 (FIGS. 3B and 3D). The inductors 22 can be chosen to block the high-frequency MRI signal (typically around 64 MHz for a 1.5 Tesla field strength) but to pass lower frequency signals such as the electrophysiological signals from the brain, the heart, etc. Capacitors 20 can be provided to shunt to ground MRI signal "leaking" through inductors 22. Thus, inductors 22 and capacitors 20 may form a low pass filter. Exemplary values to filter high frequency MR signal at about 63.86 MHz can be about 10,000 pF for capacitors 20 and 5.6 µH for inductors 22.

Electrophysiological (EP) signals may be measured independently of the Transmit/Receive state of the MRI system because these signals are typically in a frequency range far below the MRI signal frequency and are separate from the MRI signal via a filter, such as the signal split and low-pass filter depicted in FIG. 3B and effected by inductors 22 and capacitors 20. The EP signals may pass through this low pass filter to the connector 16 and can be routed to the EP recording system, tissue stimulator, ablation energy source, or the like. Similarly, tissue stimulation and/or tissue ablation can be done independently of the Transmit/Receive state of the MRI system because energy sent through the connector 16 from either an ablation energy source, a cardiac stimulator, a neurostimulator, etc. is at sufficiently low enough frequencies, typically less than 500 kHz, that it will pass through the low pass filter network shown in FIG. 3B and be conveyed into the probe to one or more electrodes 3, 4, 5, 6, but will be blocked from entering the MRI system by the high pass filter formed by capacitors 23 in FIG. 3A. Examples of low voltage signals include those for the treatment of Parkinson's disease as part of Deep brain stimulation and RF energy at several hundred kilohertz that may cause, among other effects, ablation of heart tissue. In the latter case, the stimulus may be provided to only one electrode, e.g., electrode 3, which may be located at the tip of the probe, to facilitate precise delivery of heat therapy and to provide in some embodiments a large contact area.

As depicted in FIGS. 3C–E, the magnetic resonance pathway can be disposed on one substrate 26, and the electrophysiology pathway can be disposed on another substrate 28. The substrates may be coupled to a ground plane 29. The signal split at contacts 24 may be provided through holes in substrate 26 to permit a connection to contacts 27 for the electrophysiology pathway.

With further reference to FIGS. 2A–C and 3A–E, contacts 24 can mate with the appropriate pins in the connector 9. The outer conductive layer connector in connector 9 (ground) can mate with ground pin 25. During the transmit phase of the MR system, the pin diode 21 can be activated, as described above, and can thereby create a short between the plurality of center conductors 2 and the outer conductive layer 12. As described above, the electrical length of the outer conductive layer 12 and capacitors 23 may be chosen so that the short at diode 21 transfers down the transmission line into an open at junction J at which the outer conductive layer terminates.

FIGS. 4A–C depict an embodiment in which a probe is constructed to be steerable (bi-directional). Many of the features are as discussed for the embodiments shown in FIGS. 1 and 2A–C. The probe 100 may include a ribbon 36 disposed in the distal portion 7 of the probe 100. In an embodiment, the ribbon 36 can extend to the tip of the probe 100. The ribbon 36 can be bonded to the tip. The probe 100 can further include a pull wire 46. The pull wire 46 can be coupled to the ribbon 36 so that the ribbon 36 may flex when the pull wire 46 is manipulated. The pull wire 46 may be disposed in a lumen 30 in the probe 30. The pull wire 46 may be coupled to a, for example, a steering disc 33, which may be disposed in a handle 34 for the user's convenience. The plurality of center conductors 2 may be radially centered; they may be offset; they may be disposed in a multi-lumen polymeric tubing; they may run along the length of the probe. A second and/or additional lumens 30 can be provided. A second and/or additional pull wires 46 can be provided. In the distal portion 7, the steering assembly may be housed in a thin walled flexible polymeric tubing to prevent direct electrical contact with the center conductors 2 and/or electrodes 3, 4, 5, 6. In the distal section the conductors may or may not be centered, may be straight or coiled (around the steering mechanism assembly), and/or may be connected to the electrodes electrically. The steering mechanism if modified into a loop coil can have a different matching-tuning and a decoupling circuit. The matching tuning and decoupling circuitry for a steering mechanism acting as a loopless antenna can be combined with that of the conductors connecting to the electrodes. Materials used for the pull wires 46 may include non-metallic materials e.g. carbon fiber, composites, nylon, etc to prevent the pull wires interacting with the center conductors 2. The pull wires 46 can also be made from conducting materials and turned either into loop or loopless coils based described elsewhere.

FIGS. 5A–C depict a similar embodiment to the one shown in FIG. 4A–C, with a coolant lumen 38 that may be provided to allow the flow of coolants. Exemplary coolants include saline solution, cooled gases, such as nitrogen, and water, among others.

Probes disclosed herein can facilitate three dimensional electro-anatomical imaging. As depicted in FIGS. 6A–D, a probe can be modified to a multi electrode array probe. The multi electrode arrays (MEA) can be arranged on an expandable basket type probe. This MEA probe can be used, for example, for non-contact or contact endocardial mapping. The probe 100 may include a plurality of expandable arms. The probe 100 may include a first dielectric layer 43. The probe 100 may include an outer conductive layer 42. The probe 100 may include a second dielectric layer 41. The probe 100 may include a shaft 44 to push the basket and expand it. The probe 100 may include a bundle 45 of 8 insulated tightly coupled conductors, resembling the center conductors described above, but in this embodiment with more conductors in the bundle and multiple bundles.

An electrode can be disposed on an arm. An electrode may be affixed to an arm. An electrode may be glued or bonded to an arm. An arm may include more than one electrode. A basket probe with, e.g., 8 expandable ribs and each carrying, e.g., 8 electrodes is depicted. FIG. 6B depicts a long-axis view of an expandable arm 39, showing 8 electrodes disposed on the arm. During insertion into the body the basket array probe may be collapsed to form a low profile probe, once inside the desired anatomic space to be mapped, such as a cardiac chamber, the basket may be expanded. The basket may be expanded, for example, by coupling a pull wire to one or more arms, or by forcing expansion with hydraulic force. The basket can expand to a variety of sizes, such as space-limited by contacting the walls of the anatomic site, or to a fixed diameter, dimension, and/or shape, such that the arms of the basket expand in a controlled manner, e.g. a cylinder. Mapping may then be carried out by non-contact mapping. The electrical potentials measured at the electrodes may be translated to the potentials on the endocardium. The arms can be formed of materials similar to those used for center conductors, as described above. The basket can be opened and closed by advancing and retracting a sliding inner tubing. The proximal shaft may include a sliding tubing centered in the outer assembly which houses the conductors, dielectric/insulator, shielding and an outer tubing. This assembly can act like a loopless antenna, the shielding/braiding in the proximal shaft acts as the ground, and the conductors connecting to the individual electrodes act as the whip of the antenna. This assembly can be matched-tuned and/or decoupled using systems and methods described above. The probe can be provided with a curved tip for, e.g., maneuvering. An ablation electrode can be incorporated as described above, such as at the distal tip. Steering systems as described above can be provided. A steerable ablation multielectrode array can facilitate mapping and treating tissue simultaneously. In an embodiment, a non-contact EP map can be superimposed on a 3-D MR image of the endocardium by using techniques described in, e.g., U.S. Pat. No. 5,662,108, hereby incorporated herein by reference. In an embodiment, miniature loop coils may be placed adjacent one or more electrodes to track the position of the one or more electrodes and the distance from the electrode to the tissue wall.

FIGS. 8A–C depict schematic diagrams of an exemplary embodiment of a bi-directional steerable probe. In an embodiment, a steerable probe may have two sections, a stiff proximal section and a steerable distal section. In an embodiment, a steerable distal section can have a length in the range of about 1 cm to about 15 cm. The steering can be achieved by including a fixed ribbon wire in the distal section of the probe. The proximal section of the flat ribbon wire can be anchored in the transition between the stiff and flexible sections. The transition may include a joint, such as a weld or a spot adhesive. The distal end of the flat wire can be bonded to the distal tip of the probe. The pull wires/steering mechanism wires may run along the length of the probe. The proximal end of the pull wires can be attached to the steering mechanism. The distal end of the pull wires/steering mechanism may be attached to the distal end of the flat ribbon, which is then bonded to the distal tip of the probe. In operation, pulling or releasing the pull wire can bend or steer the distal tip in the direction of the pull. The extent of the bending typically depends on at least one of the inner diameter (ID) of the outer tubing (distal section), the overall stiffness of the tubing/assembly, and on other properties of the assembly. Steerable probes may be modified so that they work like a RF loop antenna coil, so that they may be actively tracked under MR. This helps the operating clinician to know the exact position of the probe in the anatomy.

Steerable probes may be modified for MR compatibility by using non-magnetic materials. Steerable probes may be modified for MR compatibility by using materials which create few or no susceptibility artifacts. Appropriate materials include, e.g., polymers/plastics, metals—Nitinol, copper, silver or gold, gold platinum alloy, MP35N alloy, etc. An exemplary design of the probes is shown in FIGS. 8A–C. The proximal shaft of the probe may include a multi-lumen tubing with at least 2 lumens parallel to each other. These lumens can house a number of pull wires, such as 2 pull wires. The pull wires may be connected to the steering handle at the proximal end, and at the distal end they may be connected to the distal end of the flat ribbon wire assembly, the proximal end of which may be anchored in the transition. The two parallel pull wires connected to the flat steering ribbon at the distal end can form a loop antenna which can then be matched-tuned and/or decoupled by the circuitry in the proximal handle. This creates an MR compatible, MR safe bi-directional steering probe whose position can be tracked under MRI.

Alternatively, as shown in FIGS. 8A–C, a bi-directional steerable probe may include a loopless antenna. In this exemplary embodiment, the outer proximal tubing has a braid under it or in the wall of the outer tubing. This assembly acts like a loopless antenna, with the pull wires and the flat ribbon assembly as the whip and the braiding in or under the outer tubing as the ground forming a loopless antenna. The matching-tuning and decoupling circuits may be built proximal to the probe, e.g. in the steering handle. This design enables the probe to be tracked under MR and capable of acquiring high resolution images in the vicinity of the probe.

FIGS. 9A–C and 10A–C depict exemplary embodiments of unidirectional steerable probes. These embodiments may be similar to in design to the loopless bi-directional steerable probe, except that there is a single pull wire. This design can be used to image under MRI and also to be tracked under MR. The proximal shaft/section can have a braiding in the wall or under the outer tubing. The pull wire may run radially in the center of the tubing thus creating a structure similar to a coaxial cable (FIGS. 10A–C) or can be radially offset from the center (FIGS. 9A–C). The matching-tuning and decoupling circuit can be built in the proximal section of the probe, making it function similar to a loopless antenna, and/or enabling it to be tracked under MRI. It can also be used to acquire high-resolution images of the anatomy around the probe.

Additional teachings regarding construction of magnetic resonance probes, selection of materials, preferable dimensions of components, and electrical properties of probes are provided, e.g., in U.S. Pat. Nos. 5,928,145, 6,263,229, 6,549,800, and in U.S. Patent Application Publication Nos. US 2002/0045816 A1, US 2002/0161421 A1, US 2003/0028095 A1, and US 2003/0050557 A1, all of which patents and patent application publications are hereby incorporated herein in their entireties by this reference.

While the disclosed systems and methods have been described in connection with embodiments shown and described in detail, various modifications and improvements thereon will become readily apparent to those skilled in the art. Accordingly, the spirit and scope of the present disclosure is limited only by the following claims.

We claim:

1. A magnetic resonance probe, comprising:
   a plurality of center conductors, at least some center conductors including a conductive core and an insulator disposed at least partially about the core along at least a portion of the core;
   a first dielectric layer disposed at least partially about the plurality of center conductors in a proximal portion of the probe;
   an outer conductive layer at least partially disposed about the first dielectric layer; and
   a plurality of electrodes, at least one electrode being coupled to one of the center conductors and disposed at least partly on a probe surface;
   a ribbon disposed in a distal portion of the probe; and
   a pull wire coupled to the ribbon.

2. The probe of claim 1, further comprising a second dielectric layer at least partially disposed about the outer conductive layer.

3. The probe of claim 1, further comprising a lubricious coating at least partially disposed about the outer conductive layer.

4. The probe of claim 1, wherein at least one insulator has a thickness equal to or less than about 100 microns.

5. The probe of claim 1, further comprising a connection to a high-pass filter through which the probe is coupleable to a magnetic resonance scanner.

6. The probe of claim 1, further comprising a connection to a low-pass filter through which the probe is coupleable to at least one of an electrophysiological recording system, a tissue stimulator, and an ablation energy source.

7. The probe of claim 1, wherein the pull wire is disposed in a lumen in the probe.

8. The probe of claim 1, further comprising a coolant lumen.

9. The probe of claim 1, further comprising a plurality of radially expandable arms, wherein at least one electrode is at least partly disposed on one arm.

10. The probe of claim 1, further comprising an ablation electrode disposed at a distal tip of the probe.

11. The probe of claim 1, further comprising an interface circuit coupled to the probe, the interface circuit including:
    a signal splitter that directs a signal received from the probe to a magnetic resonance pathway and an electrophysiology pathway;
    a high-pass filter disposed in the magnetic resonance pathway;
    a low-pass filter disposed in the electrophysiology pathway;
    a connector disposed in the magnetic resonance pathway for connecting to a magnetic resonance scanner; and
    a connector disposed in the electrophysiology pathway for connecting to at least one of a tissue stimulator, a biopotential recording system, and an ablation energy source.

12. The probe of claim 1, further comprising a connector portion disposed at a proximal end of the probe, the connector portion including:
    an outer conductor contact coupled to the outer conductive layer;
    extended sections of at least some center conductors extending proximally beyond the outer conductor contact, at least one extended section having a center conductor contact coupled to one center conductor; and
    an insulated area interposed between the outer conductor contact and the at least one center conductor contact.

13. A system for magnetic resonance imaging, comprising:
- the magnetic resonance probe of claim 1
- a interface electrically coupled to the probe, the interface including:
  - a signal splitter that directs a signal received from the probe to a magnetic resonance pathway and an electrophysiology pathway;
  - a high-pass filter disposed in the magnetic resonance pathway;
  - a low-pass filter disposed in the electrophysiology pathway;
  - a connector disposed in the magnetic resonance pathway for connecting to a magnetic resonance scanner; and
  - a connector disposed in the electrophysiology pathway for connecting to at least one of a tissue stimulator, a electrophysiological recording system, and an ablation energy source.

14. A magnetic resonance probe, comprising:
- a plurality of center conductors, at least some center conductors including a conductive core and an insulator disposed at least partially about the core along at least a portion of the core;
- a first dielectric layer disposed at least partially about the plurality of center conductors in a proximal portion of the probe;
- an outer conductive layer at least partially disposed about the first dielectric layer; and
- a plurality of electrodes, at least one electrode being coupled to one of the center conductors and disposed at least partly on a probe surface; and
- an ablation electrode disposed at a distal tip of the probe.

15. A system for magnetic resonance imaging, comprising:
- the magnetic resonance probe of claim 14; and
- a interface electrically coupled to the probe, the interface including:
  - a signal splitter that directs a signal received from the probe to a magnetic resonance pathway and an electrophysiology pathway;
  - a high-pass filter disposed in the magnetic resonance pathway;
  - a low-pass filter disposed in the electrophysiology pathway;
  - a connector disposed in the magnetic resonance pathway for connecting to a magnetic resonance scanner; and a ribbon disposed in a distal portion of the probe; and a pull wire coupled to the ribbon
  - a connector disposed in the electrophysiology pathway for connecting to at least one of a tissue stimulator, a electrophysiological recording system, and an ablation energy source.

16. A magnetic resonance probe, comprising:
- a plurality of center conductors, at least some center conductors including a conductive core and an insulator disposed at least partially about the core along at least a portion of the core;
- a first dielectric layer disposed at least partially about the plurality of center conductors in a proximal portion of the probe;
- an outer conductive layer at least partially disposed about the first dielectric layer; and
- a plurality of electrodes, at least one electrode being coupled to one of the center conductors and disposed at least partly on a probe surface; and
- a plurality of radially expandable arms, wherein at least one electrode is at least partly disposed on one arm.

17. The probe of claim 16, further comprising an ablation electrobe disposed at a distal tip of the probe.

18. A system for magnetic resonance imaging, comprising:
- the magnetic resonance probe of claim 16; and
- a interface electrically coupled to the probe, the interface including:
  - a signal splitter that directs a signal received from the probe to a magnetic resonance pathway and an electrophysiology pathway;
  - a high-pass filter disposed in the magnetic resonance pathway;
  - a low-pass filter disposed in the electrophysiology pathway;
  - a connector disposed in the magnetic resonance pathway for connecting to a magnetic resonance scanner; and a ribbon disposed in a distal portion of the probe; and a pull wire coupled to the ribbon.
  - a connector disposed in the electrophysiology pathway for connectin to at least one of a tissue stimulator, a elecrophysiological recording system, and an ablation energy source.

* * * * *